United States Patent
Suzuki et al.

(10) Patent No.: US 6,750,542 B2
(45) Date of Patent: Jun. 15, 2004

(54) SPUTTER TARGET, BARRIER FILM AND ELECTRONIC COMPONENT

(75) Inventors: Yukinobu Suzuki, Koza-gun (JP); Takashi Ishigami, Yokohama (JP); Yasuo Kohsaka, Yokohama (JP); Naomi Fujioka, Zama (JP); Takashi Watanabe, Yokohama (JP); Koichi Watanabe, Yokohama (JP); Kenya Sano, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/257,404

(22) PCT Filed: Apr. 20, 2001

(86) PCT No.: PCT/JP01/03379
§ 371 (c)(1),
(2), (4) Date: Oct. 21, 2002

(87) PCT Pub. No.: WO01/81650
PCT Pub. Date: Nov. 1, 2001

(65) Prior Publication Data
US 2003/0116849 A1 Jun. 26, 2003

(30) Foreign Application Priority Data
Apr. 20, 2000 (JP) ......................................... 2000-119539

(51) Int. Cl.[7] ................................................ H01L 23/48
(52) U.S. Cl. ....................... 257/751; 257/767; 257/295; 257/763; 257/765
(58) Field of Search ................................ 257/757, 770, 257/768, 295, 767, 763, 764, 765

(56) References Cited

U.S. PATENT DOCUMENTS 5,456,815 A   10/1995   Fukuyo et al.

FOREIGN PATENT DOCUMENTS

| JP | 6-280009    | 10/1994 |
| JP | 6-322530    | 11/1994 |
| JP | 8-134635    | 5/1996  |
| JP | 2000-100755 | 4/2000  |
| JP | 2000-273623 | 10/2000 |
| JP | 2000-328242 | 11/2000 |

OTHER PUBLICATIONS

English Translation of International Preliminary Examination Report for PCT/JP01/03379.

*Primary Examiner*—Nathan J. Flynn
*Assistant Examiner*—Pershelle Greene
(74) *Attorney, Agent, or Firm*—Oblon, Spivak, McClelland, Maier & Neustadt, P.C.

(57) ABSTRACT

A sputter target is made of a Ti—Al alloy containing Al in the range of 1 to 30 atm %. In the Ti—Al alloy constituting the sputter target, Al exists in at least one of a solid solution state in Ti and a state in which Al forms an intermetallic compound with Ti, and variation in Al content in the entire target is limited within 10%. Furthermore, an average crystal grain diameter of the Ti—Al alloy is 500 μm or less, and variation in crystal grain diameter in the entire target is limited within 30%. A Ti—Al—N film as a barrier film is formed by using the sputter target made of the Ti—Al alloy as described above. An electronic component includes a barrier film formed on a semiconductor substrate.

18 Claims, 1 Drawing Sheet

SPUTTER TARGET, BARRIER FILM AND ELECTRONIC COMPONENT

TECHNICAL FIELD

The present invention relates to a sputter target suitable for forming a barrier material for a semiconductor substrate or the like and to a barrier film and an electronic component using the same.

BACKGROUND ART

A storage device using a ferroelectric thin film as a storage medium, namely, a so-called ferroelectric memory (FRAM), has recently been under active development. The ferroelectric memory, which is nonvolatile, has such a characteristic that storage capacity thereof is not lost even after power source is cut off. Furthermore, spontaneous polarization inversion is very rapid if the film thickness of the ferroelectric thin film is sufficiently small, so that a rapid write and read comparable to DRAM can be realized. Since a memory cell of one bit can be constituted by a single transistor and a single ferroelectric capacitor, the ferroelectric memory is also suitable for mass storage.

As a ferroelectric material, lead zirconate titanate (a solid solution of $PbZrO_3$ and $PbTiO_3$ (PZT)) having a perovskite structure is mainly used. PZT, however, has such a disadvantage that its major component Pb is likely to be diffused and vaporized at a relatively low temperature (approximately 500° C.), even though having such characteristics of a high Curie temperature (approximately 300° C.) and large spontaneous polarization, and therefore, it is said to be difficult for PZT to cope with miniaturization. Barium titanate ($BaTiO_3$ (BTO)) is known as a typical ferroelectric material besides PZT. BTO, however has such a disadvantage that remanent polarization thereof is greatly temperature-dependent due to small remanent polarization and a low Curie temperature (approximately 120° C.) compared with PZT.

It has been found out, however, that BTO, when epitaxially grown on a Pt/MgO(100) substrate, allows a BTO film having a film thickness of, for example, 60 nm to exhibit the Curie temperature of 200° C. or higher. Moreover, it has been confirmed that, when barium strontium titanate ($Ba_aSr_{1-a}TiO_3$ (BSTO)) is epitaxially grown on a lower electrode made of Pt and strontium ruthenate ($SrRuO_3$ (SRO)), ferroelectricity appears in a composition region ($a \leq 0.7$) which is not expected to exhibit the ferroelectricity by nature. This is because a lattice of a BSTO crystal in a C-axis direction is extended.

Since a ferroelectric Curie temperature shifts to a higher temperature side in such a BSTO film of a Ba rich, large remanent polarization is obtainable in a room temperature zone, and sufficiently large remanent polarization can be retained even when the temperature is increased up to approximately 85° C. Consequently, a ferroelectric film suitable for the storage medium of FRAM can be realized. Meanwhile, the use of BSTO of an Sr rich can realize a thin-film capacitor whose dielectric constant reaches several times (for example, 800 or higher) as that of a capacitor made of a polycrystalline film. Such a dielectric property is suitable for DRAM.

The practical availability of semiconductor memories such as FRAM and DRAM is expected through the use of the thin-film capacitor having the epitaxially grown BTO film and BSTO film as described above. In putting these into practical use, it is necessary to combine a semiconductor substrate on which a switching transistor is formed and a memory cell using a perovskite oxide film (thin-film capacitor). At this time, a problem exists that the diffusion of elements such as Pt, Ru, Sr, and Ba, which constitute the lower electrode and the dielectric thin film of the thin-film capacitor, into the transistor has an adverse effect on a switching operation.

Under the circumstances, a barrier film which prevents mutual diffusion needs to be formed between the thin-film capacitor and the semiconductor substrate. Further, the barrier film itself needs to be epitaxially grown on the semiconductor substrate in order to obtain the above-described epitaxial effect. The use of a titanium nitride (TiN) film and a film made of $Ti_{1-x}Al_xN$(Ti—Al—N) which is a solid solution of TiN and aluminum nitride (AlN) has been studied as such a barrier film.

TiN, which is superior in a barrier property against Al and the like, is also utilized as a barrier metal in generally-used Si devices. It is also excellent in thermal stability since it is a chemical compound whose melting point is high (3000° C. or higher), and has a very low specific resistance, approximately 50 $\mu\Omega$·cm in a polycrystalline film and approximately 18 $\mu\Omega$·cm in an epitaxial film, which results in an advantage that contact resistance can be lowered in utilizing an electric property in the thickness-wise direction.

When TiN is used as the barrier film of the thin-film capacitor, however, oxygen is diffused onto the TiN film, for example, due to annealing at a high temperature (for example, 600° C. or higher) conducted in an element production process for controlling crystallization of the ferroelectric film so that nitrogen (N) in TiN is substituted by oxygen (O) to form an oxide film, namely, $TiO_2$. The lower electrode made of Pt, SRO, and so on becomes inferior in adherence due to volume expansion thereof based on $TiO_2$ generated on the surface of the TiN film and due to the generation of $N_2$ gas. This results in a problem that peeling occurs in the lower electrode.

When Al is added to TiN to form the $Ti_{1-x}Al_xN$(Ti—Al—N) film, oxidation resistance can be enhanced. The Ti—Al—N film is formed by reactive sputtering in an atmosphere of argon (Ar) and nitride (N), using a $Ti_{1-x}Al_x$ alloy (a Ti—Al alloy) target. Concerning the Ti—Al alloy target, for example, Japanese Patent Laid-open Application No. Hei 6-322530 specifies a Ti—Al alloy target constituted only of a diffusion reaction layer of high-purity Ti and high-purity Al.

Further, aiming at enhancing abrasion resistance and oxidation resistance of cutting tools, sliding components, and so on, Japanese Patent Laid-open Application No. Hei 8-134635 specifies a Ti—Al alloy target material with a relative density of 99.0 to 100% and free of any continuous defect from the surface to the bottom surface thereof. Japanese Patent Laid-open Application No. 2000-100755 specifies a Ti—Al alloy target for forming a barrier film of a semiconductor device, whose O content is in the range of 15 to 900 ppm.

Further, Japanese Patent Laid-open Application No. 2000-273623 specifies a Ti—Al alloy target, in which an Al content is 5 to 65 wt %, a radio active element such as U and Th is 0.001 ppm or lower, an alkali metal such as Na and K is 0.1 ppm or lower, Fe which is a transition metal is 10.0 ppm or lower, Ni is 5.0 ppm or lower, Co is 2.0 ppm or lower, Cr is 2.0 ppm or lower, and purity thereof including impurities is 99.995% or higher, and Japanese Patent Laid-open Application No. 2000-328242 specifies a Ti—Al alloy target containing 15 to 40 atm % or 55 to 70 atm % of Al and having a metal structure with an area ratio of a $Ti_3Al$ intermetallic compound being 30% or higher, and in which the number of defects with a diameter of 0.1 mm or larger is 10/100 $cm^2$ or less. Thus, various kinds of Ti—Al alloy targets have been developed.

The Ti—Al—N film which is formed by reactive-sputtering the conventional Ti—Al alloy target, however, is inferior in an epitaxial growth property on an Si substrate, which results in a problem of hindering the epitaxial growth of the BTO film and the BSTO film. In FRAM using such a BTO film or a BSTO film, a ferroelectric property such as remanent polarization is not sufficiently obtainable to lower the property and production yields of FRAM. When they are applied to DRAM, the property and production yields thereof are similarly lowered as well.

Further, when the Ti—Al—N film is formed by reactive-sputtering the conventional Ti—Al alloy target, sudden generation of huge dust is likely to occur while the film is formed by sputtering, which results in a problem of lowering the production yields of FRAM and DRAM. Such a problem is caused not only when the Ti—Al—N film is used as the barrier film of the thin-film capacitor but also when the Ti—Al—N film is used as the barrier film of a generally-used semiconductor element.

As described above, though the Ti—Al—N-film has a characteristic of being excellent in oxidation resistance by nature, it cannot be necessarily said that sufficient studies have been made on the composition, nature, and so on of the $Ti_{1-x}Al_x$ alloy target used for the formation thereof. This is why such problems occur that the epitaxial growth property of the Ti—Al—N film on the Si substrate is degraded and in addition, the sudden generation of the huge dust is caused.

An object of the present invention is to provide a sputter target enabling the formation of a Ti—Al—N film excellent in the property and quality as a barrier film with good reproducibility. More specifically, an object of the present invention is to provide a sputter target enabling the epitaxial growth of the Ti—Al—N film with good reproducibility, and a sputter target enabling the reduction in the dust generation. Another object is to provide, through the use of such a sputter target, a barrier film and an electronic component whose property, quality and production yields are enhanced.

DISCLOSURE OF THE INVENTION

As a result of studies, with the aim of solving the above-described objects, on the influence that Al composition, a crystal grain diameter, and so on in a Ti—Al alloy target give to a Ti—Al—N film, the inventors of the present invention have found out that it is possible to enhance an epitaxial growth property of the Ti—Al—N film and to reduce dust generation when Al in an Ti—Al alloy is first solid-solubilized in Ti or is made to exist as an intermetallic compound with Ti to obtain a uniform alloy structure (target structure).

It has been found out that especially the epitaxial growth property of the Ti—Al—N film is greatly enhanced by reducing variation in Al content in the entire target. In other words, reduction in segregation of Al enhances the epitaxial growth property of the Ti—Al—N film. Meanwhile, it has been found out that the dust generation is greatly reduced by reducing variation in crystal grain diameter in the entire target.

The present invention is made based on the above findings. A first sputter target of the present invention is a sputter target comprising a Ti—Al alloy, characterized in that Al in the Ti—Al alloy exists in at least one of a solid solution state in Ti and a state in which Al forms an intermetallic compound with Ti, and that variation in Al content in the entire target is within 10%.

A second sputter target of the present invention is a sputter target comprising a Ti—Al alloy, characterized in that Al in the Ti—Al alloy exists in at least one of a solid solution state in Ti and a state in which Al forms an intermetallic compound with Ti, that an average crystal grain diameter of the Ti—Al alloy is 500 $\mu$m or smaller, and that variation in the crystal grain diameter in the entire target is within 30%.

In the sputter target of the present invention, the Ti—Al alloy preferably contains Al in the range of 1 to 30 atm %.

A barrier film of the present invention is characterized in that it comprises a Ti—Al—N film formed by using the sputter target of the present invention described above. The barrier film of the present invention is suitably used as a barrier material for a semiconductor substrate.

An electronic component of the present invention is characterized in that it comprises the barrier film of the present invention described above. As a concrete form of the electronic component of the present invention, a semiconductor memory comprising a semiconductor substrate, the barrier film formed on the semiconductor substrate, and a thin-film capacitor formed on the barrier film can be named.

MODE FOR IMPLEMENTING THE INVENTION

Figure 1:
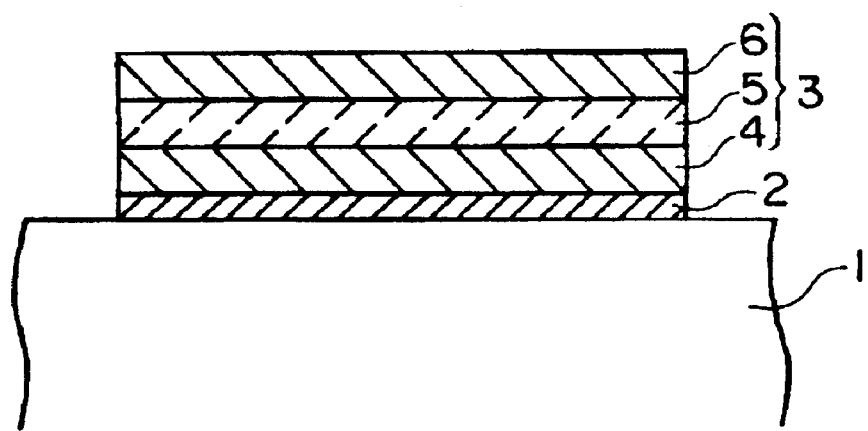
FIG. 1 is a cross sectional view showing a schematic structure of an electronic component according to an embodiment of the present invention.

An embodiment of the present invention will be hereinafter explained.

A sputter target of the present invention is made of a Ti—Al alloy, and is used for forming, for example, a Ti—Al—N film. Al in the Ti—Al alloy exists in a solid solution state in Ti or as an intermetallic compound with Ti. As the intermetallic compound of Ti and Al, $TiAl$, $TiAl_3$, $TiAl_2$, $Ti_3Al$, and the like can be named.

A uniform alloy structure is obtainable when Al is thus made to exist as a solid solution phase or an intermetallic compound phase. In other words, it is possible to make the sputter target structure a uniform solid solution structure of Ti and Al, a uniform intermetallic compound structure of Ti and Al, or a uniform mixed structure of the solid solution and the intermetallic compound. An epitaxial growth property of the Ti—Al—N film is enhanced by obtaining such a uniform target structure.

In contrast, when Al is precipitated as a single phase or segregation of Al is caused in the Ti—Al alloy (sputter target), epitaxial growth is hindered. Al is solid-solubilized in Ti up to its solid solubility limit, and Al exceeding the solid solubility limit exists as the intermetallic compound with Ti, but it is highly possible that the segregation of Al occurs depending on the Al composition and a production method. In the present invention, the precipitation and segregation of Al are prevented.

It can be confirmed here by X-ray diffraction that Al in the Ti—Al alloy target exists as the solid solution phase or the intermetallic compound phase. More specifically, after a sample is taken from an arbitrary position of the Ti—Al alloy target, the surface thereof is polished to #1000 and further subjected to buffing. A desired X-ray diffraction pattern of such a sample is such that only the peak of Ti and the peak of the Ti—Al intermetallic compound (TiAl, $TiAl_3$, TiAl$_2$, and the like) appear therein in effect. In other words, it is confirmed that Al exists as at least one of the solid solution phase and the intermetallic compound phase if the peak of Al does not appear in effect.

Incidentally, it is defined that an effective peak in the X-ray diffraction pattern has an intensity ratio of 1/20 of the maximum intensity peak or higher. The X-ray diffraction is conducted under the measurement conditions of X-ray: Cu, K-α1, voltage: 50 kV, electric current: 100 mA, a vertical goniometer, a divergence slit: 1 deg, a scattering slit: 1 deg, a light-receiving slit: 0.15 mm, a scan mode: continuous, a scan speed: 5°/min, and a scan step: 0.05°.

The Ti—Al alloy constituting the sputter target of the present invention preferably contains Al in the range of 1 to 30 atm %. An Al content in the Ti—Al alloy target exceeding 30 atm % increases the possibility that Al which should be solid-solubilized in Ti or should form the intermetallic compound with Ti is precipitated as a single phase. Namely, the segregation of Al is easily caused. The precipitation of Al as a single phase lowers the epitaxial growth property of the Ti—Al—N film when the Ti—Al—N film is formed by sputtering through the use of the Ti—Al alloy target. Moreover, the resistance and so on of the Ti—Al—N film increase to degrade the characteristic as the barrier film.

By limiting the Al content in the Ti—Al alloy target to 30 atm % or smaller, the target structure can be the uniform solid solution structure of Ti and Al, the uniform intermetallic compound structure of Ti and Al, or the uniform mixed structure of the solid solution and the intermetallic compound. Such a uniform target structure can also make the resultant Ti—Al—N film structure a uniform solid solution structure of TiN and Al or a solid solution structure of TiN and AlN.

When the Al content in the Ti—Al alloy target is smaller than 1 atm %, however, the effect of enhancing oxidation resistance that it ought to have is not fully obtainable. For example, oxidation easily progresses in the Ti—Al—N film formed by using the Ti—Al alloy target whose Al composition is lower than 1 atm % so that adherence to a film formed thereon is weakened, which easily causes peeling. For example, adherence between the Ti—Al—N film and a lower electrode of the thin-film capacitor is weakened.

Further, Al in the Ti—Al—N film not only enhances the oxidation resistance of the film itself but also functions as a trap material of oxygen. For example, when an electrode film made of a conductive oxide such as SRO is formed on the Ti—Al—N film, the diffusion of oxygen in this conductive oxide into a film-forming substrate such as a semiconductor substrate is restrained. From this point of view, it is also preferable that the Al content in the Ti—Al alloy target is 1 atm % or higher.

An Al content (Al composition) of the Ti—Al alloy constituting the sputter target of the present invention is more preferably in the range of 1 to 20 atm % in order to restrain oxidation of the barrier film itself more effectively and further enhance the epitaxial growth property of the resultant film. It is still more preferable that the Al composition is in the range of 5 to 15 atm %.

Further, in the sputter target of the present invention, variation in the content of Al which is solid-solubilized in Ti or exists as the intermetallic compound with Ti is limited within 10% in the entire target. When the variation in the Al content in the entire target is limited to a low value, a smooth epitaxially grown film is obtainable with good reproducibility. The variation in the Al content exceeding 10% causes a difference, for example, in a crystal growth property of Ti—Al—N due to a partial difference in the Al composition of the resultant film so that the epitaxial growth property as the entire film is degraded. The variation in the Al content in the entire target is preferably within 5%, more preferably within 1%.

Here, the variation in the Al content in the entire target is defined as a value derived in the following manner. Namely, when the target is in a disc shape, samples are taken from respective positions (totally 5 positions including a center part), the respective positions being the center part of the target and positions 10% deviated from positions at which the periphery crosses two straight lines passing the center part and equally dividing the circumference, the Al content of each of these five samples is measured ten times, and an average value of the ten measured values is defined as the Al content of each of the samples. Then, the variation [%] defined in the present invention is calculated from the maximum value and the minimum value of these measured values based on an expression of {(maximum value−minimum value)/(maximum value+minimum value)}×100. A value measured by inductively coupled plasma emission spectroscopy in general use is used as the Al content.

The sputter target of the present invention is preferably constituted of a high-purity Ti—Al alloy. Since especially oxygen among impurities included in the Ti—Al alloy degrades the epitaxial growth property of the resultant Ti—Al—N film, an average oxygen content of the Ti—Al alloy is preferably 900 ppm or lower. Further, oxygen promotes oxidation of the resultant Ti—Al—N film to lower adherence of a film (for example the lower electrode of the thin-film capacitor) formed thereon. Also from this point of view, the average oxygen content of the Ti—Al alloy is preferably limited to 900 ppm or lower.

Complete removal of oxygen from the Ti—Al alloy target, however, may possibly degrade a barrier property of the resultant Ti—Al—N film, and therefore, the Ti—Al alloy target preferably contains a minute amount of oxygen. Specifically, the Ti—Al alloy target preferably contains oxygen in the range of 10 to 500 ppm. The oxygen content is more preferably in the range of 50 to 400 ppm. Such an amount of oxygen effectively functions for the barrier property of the Ti—Al—N film.

Variation in the oxygen content in the Ti—Al alloy target is preferably within 30% as the entire target. When the variation in the oxygen content in the entire target is limited to a low value, the epitaxial growth property, the oxidation resistance, and so on of the Ti—Al—N film formed by using it can be enhanced over the entire film with good reproducibility. Moreover, the barrier property of the resultant Ti—Al—N film can be made uniform. The variation in the oxygen content in the entire target is calculated in the same manner as that for the aforesaid variation in the Al content. A value measured by an inert gas fusion-infrared absorption method in general use is used as the oxygen content.

Incidentally, the sputter target of the present invention (the Ti—Al alloy target) may contain some amount of impurity elements other than oxygen if the level of its content is about the same as that in a general high-purity metal material. It is also preferable, however, that an content of other impurity elements is reduced similarly to the oxygen content in order to realize the enhancement in the epitaxial growth property and so on.

In the sputter target of the present invention, an average grain diameter of crystal grains (average crystal grain diameter) constituting the Ti—Al alloy is preferably 500 μm or smaller. Further, variation in the crystal grain diameter in the entire target is preferably within 30%. When the crystal grains constituting the Ti—Al alloy target are made relatively microscopic and the variation in the crystal grain diameter in the entire target is reduced, dust generation can be reduced.

There are many reports on the correlation between the crystal grain diameter of the target and the dust. What is called dust generally includes flaky substances which are generated when grains scattered by sputtering, after adhering to an adhesion preventive board disposed in a sputtering device and a non-erosion region of the target, peel off these places, and molten grains called splashes which are generated due to abnormal discharge caused by a potential difference occurring in a gap among crystal grains. In any case, it generally means the above substances which are approximately 0.2 to 0.30 μm in size.

In contrast, the dust generated suddenly from the conventional Ti—Al alloy target is 1 μm or larger in size, which is relatively large compared with the dust described above. Further, it is in a rock-like massive shape. This massive dust is in such a mode in which a part of the crystal grains or the crystal grains themselves are extracted by the sputtering. When the variation in the crystal grain diameter in the entire target exists, the occurrence rate of such a huge dust increases.

On the other hand, when the average crystal grain diameter of the Ti—Al alloy target is limited to 500 μm or smaller and the variation in the crystal grain diameter in the entire target is limited within 30%, it becomes possible to reduce the scattering of a part of the crystal grains or the crystal grains themselves which is caused by the influence of thermal stress or the like. As a result, the generation of the huge dust can be reduced and the yields of the Ti—Al—N film can be greatly enhanced.

The crystal grain diameter of the Ti—Al alloy target is more preferably 300 μm or smaller, still more preferably 200 μm or smaller. Further, the variation in the crystal grain diameter in the entire target is more preferably within 15%, still more preferably within 10%. Incidentally, as is previously described, the uniform solid solution structure in which Al is solid-solubilized in Ti and the uniform intermetallic compound structure of Ti and Al also work effectively for the reduction of the huge dust.

Here, the average crystal grain diameter of the Ti—Al alloy target is defined as a value derived in the following manner. First, samples are taken from the surface of the sputter target, the surfaces of the samples are etched with an etching solution in which HF:HNO$_3$:H$_2$O=2:2:1, and thereafter, structure observation is conducted with an optical microscope. A circle with a predetermined area (diameter 79.8 mm) is depicted on a field of view for measurement or on a picture of the optical microscope, and the number of the crystal grains completely embraced in the circle (number A) and the number of the crystal grains cut off by the periphery (number B) are counted. The magnification of the measurement is so set that the number of the crystal grains completely embraced in the circle is 30 or larger. The total number n of the crystal grains in the circle is defined as a value of the number A+the number B/2 in which the number B of the crystal grains is converted to ½. An average crystal grain diameter d (mm) is calculated from this total number n of the crystal grains in the circle, the measurement magnification M, and an area A (mm$^2$) of the circle based on the following expression.

$$d=(A/n)^{1/2}/M$$

In order to calculate the variation in the crystal grain diameter in the entire target, samples are taken from respective positions (totally nine positions including a center part), the respective positions being the center part of the target, positions near positions at which the periphery crosses the two straight lines passing the center part and equally dividing the circumference, and positions as half distant from the periphery as the above positions, an average crystal grain diameter of each of the nine samples is measured ten times in the aforesaid method, and the average value of the ten measured values is defined as the crystal grain diameter of each of the samples. Then, the variation [%] of the crystal grain diameter defined in the present invention is calculated from the maximum value and the minimum value of these measured values based on the expression of {(maximum value−minimum value)/(maximum value+minimum value)}×100. Note that the shape of the sample is 10 mm in length and 10 mm in width.

The sputter target of the present invention is preferably produced by applying melting methods as described below, though a production method thereof is not specially limited to the following methods, and further, it is preferable that the variation in the Al content is reduced by controlling various conditions of each of the melting methods.

Ti and Al whose purity is as high as approximately 4N are prepared first, and they are melted by an arc melting method, an electron beam (EB) melting method, a cold wall melting method, or the like to produce a Ti—Al alloy ingot. Especially, the cold wall melting method is preferably employed among these melting methods. The cold wall melting method, when the melting conditions thereof are controlled, enables to obtain, with good reproducibility, a uniform alloy structure in which the segregation of Al is reduced. The cold wall melting method is also effective in reducing the impurity elements and reducing the variation therein.

As concrete conditions in employing the cold wall melting method, the pressure before the start of the melting is first set to approximately $1\times10^{-6}$ Pa ($1\times10^{-4}$ to $1\times10^{-7}$ Pa), and degassing (baking) is carried out about twice before the melting. The pressure at the start of the melting is set to approximately $1\times10^{-5}$ Pa ($1\times10^{-4}$ to $1\times10^{-6}$ Pa), and the pressure while the melting is carried out is set to approximately $1\times10^{-4}$ Pa ($1\times10^{-3}$ to $1\times10^{-5}$ Pa). Power supply at the start of the melting is set to approximately 5 kW, and the maximum pressure while the melting is carried out is set to approximately 230 kW. Melting time is preferably set to approximately 40 minutes.

It is preferable to further carry out solution treatment at a temperature in the range of 80 to 90% of a melting point of the Ti—Al alloy after the cold wall melting is carried out in order to reduce the variation in the Al content. The solution treatment is preferably carried out in a vacuum at $1\times10^{-1}$ Pa or lower or an Ar atmosphere for 24 hours or longer. Such solution treatment is effective not only for reducing the variation in the Al content but also for reducing the variation in the oxygen content and miniaturizing and uniformizing the crystal grain diameter.

When the solution treatment temperature is too high here, the crystal grains grow rapidly to be liable to crack. On the other hand, when the solution treatment temperature is too low, sufficient dispersion effect of Al is not obtainable. In view of the above, the solution treatment temperature is preferably in the range of 80 to 90% of the melting point of the Ti—Al alloy. It is more preferably in the range of 85 to 90% of the melting point. Further, since an insufficient degree of vacuum at the time of the solution treatment tends to cause oxidation of the Ti—Al alloy, the pressure at this time should be at $1\times10^{-1}$ Pa or lower. Further, when the solution treatment time is too short, the dispersion effect of Al becomes insufficient, and therefore, the solution treatment time is preferably 24 hours or longer.

Incidentally, since the arc melting method and the EB melting method are highly possible to cause the segregation of Al, it is preferable to carry out the melting a plurality of times (for example, twice to three times). The arc melting and the EB melting thus carried out a plurality of times can reduce the segregation of Al.

Next, the resultant ingot undergoes a plastic work such as forging and rolling when necessary. The working ratio at this time is, for example, 60 to 95%. Such a plastic work can give an appropriate amount of thermal energy to the ingot and the energy enables the uniformization of Al and oxygen. When the working ratio is too high, cracks tend to occur at the time it is worked. On the other hand, when the working ratio is too low, recrystallization in a later process becomes insufficient. In view of this, the working ratio at the time of the plastic work is preferably in the range of 60 to 95%. The working ratio is more preferably in the range of 70 to 90%, still more preferably in the range of 80 to 90%.

Thereafter, the Ti—Al alloy material is annealed at the temperature of 900 to 1200° C. to be recrystallized. The average crystal grain diameter and the variation therein can be controlled to be in the range prescribed in the present invention by the adjustment of conditions for the recrystallization. When the annealing temperature is too high, the grain diameter of the recrystallized grains becomes too large. On the other hand, when the annealing temperature is too low, the recrystallization becomes insufficient. Accordingly, the annealing temperature is preferably in the range of 900 to 1200° C. The annealing temperature is more preferably in the range of 950 to 1150° C., still more preferably in the range of 1000 to 1100° C.

A target material made of the Ti—Al alloy obtained by the above-described melting method is machined into a desired target shape and bonded to a backing plate made of, for example, Al and Cu so that the aimed sputter target is obtainable. In bonding it to the backing plate, diffusion bonding or brazing bonding using at least one of In, Zn, and Sn or using a brazing filler metal containing them is adoptable. Alternatively, instead of using the separate backing plate, a backing-plate shape may be formed at the same time when the sputter target is produced to form an integral-type sputter target.

The barrier film of the present invention comprises the Ti—Al—N film ($Ti_{1-x}Al_xN$ film ($0.01 \leq x \leq 0.3$)) which is formed by reactive sputtering with mixed gas of, for example, Ar and $N_2$, using the above-described sputter target (Ti—Al alloy target) of the present invention. The Ti—Al—N film thus obtained is excellent in the expitaxial growth property on the semiconductor substrate such as the Si substrate and has a good characteristic as the barrier film, and the dust generation is greatly reduced therein. The use of the Ti—Al alloy target of the present invention makes it possible to obtain the barrier film (Ti—Al—N film) excellent in its characteristic and quality with good yields.

The Ti—Al—N film of the present invention is excellent in a barrier property against various kinds of elements such as, for example, Sr and Ba, and has a low resistance, resistivity thereof being 200 $\mu\Omega$·cm or lower. Therefore, the use of such a Ti—Al—N film as the barrier film between the semiconductor substrate and various kinds of elements can well reduce mutual diffusion between the semiconductor substrate and an element configuration layer. Further, oxidation of the Ti—Al—N film due to the high temperature annealing (for example, 600° C. or higher) can be prevented so that degradation in adherence on the interface between the Ti—Al—N film and the element configuration layer can be prevented. In other words, peeling-off or the like of the element configuration layer on the Ti—Al—N film can be prevented. Further, improvement in the characteristic of the element configuration layer is realized since the epitaxial growth of the element configuration layer is not hindered.

The above-described Ti—Al—N film is suitable as the barrier material for the semiconductor substrate. The barrier film of the present invention described above is applicable to various kinds of electronic components. More specifically, the barrier film of the present invention is effectively used for a semiconductor memory such as FRAM and DRAM in which a semiconductor substrate with a switching transistor formed thereon and a thin-film capacitor (memory cell) using a dielectric thin film made of a perovskite oxide are combined.

FIG. 1 is a cross sectional view schematically showing a capacitor portion of a semiconductor memory as an embodiment of an electronic component of the present invention. In the drawing, 1 denotes a semiconductor substrate (Si substrate), though not illustrated, on which a switching transistor is formed. The Ti—Al—N film ($Ti_{1-x}Al_xN$ film ($0.01 \leq x \leq 0.3$)) of the present invention described above is formed as a barrier film 2 on this semiconductor substrate 1, and a thin-film capacitor 3 is further formed thereon.

The thin-film capacitor 3 has a lower electrode 4, a dielectric thin film 5, and an upper electrode 6 which are formed in sequence on the barrier film 2. For the lower electrode 4, used is a noble metal such as Pt, Au, Pd, Ir, Rh, Re, and Ru, and an alloy thereof (Pt—Rh, Pt—Ru, and the like), or a conductive perovskite oxide such as $SrRuO_3$, $CaRuO_3$, $BaRuO_3$ and a solid solution thereof (for example, (Ba, Sr)$RuO_3$ and (Sr, Ca)$RuO_3$), or the like. A noble metal (including an alloy), a conductive perovskite oxide, or the like similar to that used for the lower electrode 4 is preferably used as a constituting material of the upper electrode 6, though not specifically limited thereto.

A dielectric material having a perovskite crystal structure is suitable for the dielectric thin film 5. As such a dielectric material, a perovskite oxide expressed as $ABO_3$ can be named. Especially, preferably used is a perovskite oxide (BSTO or the like) in which barium titanate ($BaTiO_3$ (BTO)) is a major component thereof, and a part of an A-site element (Ba) thereof is substituted by an element such as Sr and Ca or a part of a B-site element (Ti) thereof is substituted by an element such as Zr, Hf and Sn.

The perovskite oxide with BTO being the major component thereof becomes a ferroelectric substance or a paralectric substance depending on the substitution amount of the B-site element and the A-site element, and the distortion amount based on lattice distortion. Therefore, when the composition and the distortion amount of the perovskite oxide are appropriately set, the dielectric thin film 5 suitable for the intended use of the thin capacitor 3 is obtainable. For example, $Ba_aSr_{1-a}TiO_3$ (BSTO) exhibits a ferroelectric property when a mole fraction a of Ba is in the range of 0.3 to 1. Meanwhile, when the mole fraction a of Ba is in the range of 0 to 0.3, it exhibits a paraelectric property. These properties also vary depending on the substitution amount of the B-site element.

Incidentally, for the dielectric thin film 5, aperovskite oxide other than BTO and BSTO is also applicable, for example, a simple perovskite oxide such as $SrTiO_3$, $CaTiO_3$, $BaSnO_3$, and $BaZrO_3$, a complex perovskite oxide such as $Ba(Mg_{1/3}Nb_{2/3})O_3$ and $Ba(Mg_{1/3}Ta_{2/3})O_3$, and solid solution thereof. Some degree of difference in the composition of the perovskite oxide from stoichiometry is of course tolerable.

In the above-described semiconductor memory, the barrier film 2 made of the Ti—Al—N film excellent in the barrier property and oxidation resistance makes it possible to suitably form the thin-film capacitor 3 on the semiconductor substrate 1 without degrading the characteristic thereof. Especially, the lower electrode 4 of the thin-film capacitor 3 is sufficiently prevented from peeling off the barrier film 2. The film thickness of the barrier layer 2 is preferably small in such a range as to allow the diffusion preventive effect to be obtainable, and to be concrete, it is preferably in the range of 10 to 50 nm.

The Ti—Al—N film as the barrier film 2, which is an epitaxially grown film, promotes the epitaxial growth of the lower electrode 4 and the dielectric thin film 5 thereon so that it becomes possible to produce the thin-film capacitor with a suitable film thickness on the semiconductor substrate 1, the thin-film capacitor utilizing a ferroelectric property and a highly dielectric property which are induced, for example, by the distortion introduced at the time of the epitaxial growth. Consequently, a high degree of integration of such thin-film capacitors and transistors on the semiconductor substrate enables the production, with high yields, of thereafter, was annealed at 900° C. for one hour for recrystallization. Each of the alloy materials after the recrystallization was ground and polished, was thereafter diffusion-bonded to a backing plate made of Al by hot pressing, and further subjected to machining, thereby producing each of Ti—Al alloy targets with the diameter 320 mm×thickness 10 mm.

As a result of X-ray diffraction of each of the Ti—Al alloy targets thus obtained, it was confirmed that only a Ti peak and a Ti—Al intermetallic compound peak appeared in any one of X-ray diffraction patterns. In other words, each of the Ti—Al alloy targets had a uniform structure constituted of a Ti—Al solid solution structure and a Ti—Al intermetallic compound structure. Variation in the Al content, an average oxygen content, and variation in the oxygen content of each of the Ti—Al alloy targets were further measured according to the aforesaid method. The measured results are shown in Table 1.

TABLE 1

| | Sample No. | Melting method | Solution treatment Temperature* (%) | Time (h) | Hot-working working ratio (%) | Al content (at %) | Al content variation (%) | Oxygen content (ppm) | Oxygen variation (%) |
|---|---|---|---|---|---|---|---|---|---|
| EM-BODI-MENT 1 | 1 | Cold wall melting method | 90 | 30 | 95 | 3 | 2 | 600 | 12 |
| | 2 | | 90 | 24 | 80 | 3 | 4 | 430 | 8 |
| | 3 | | 85 | 24 | 80 | 3 | 6 | 510 | 20 |
| | 4 | | 85 | 24 | 65 | 3 | 7 | 670 | 34 |
| | 5 | | 80 | 24 | 65 | 3 | 10 | 260 | 10 |
| | 6 | | 90 | 40 | 92 | 9 | 1 | 380 | 18 |
| | 7 | | 90 | 40 | 60 | 9 | 3 | 450 | 8 |
| | 8 | | 85 | 35 | 60 | 9 | 5 | 250 | 10 |
| | 9 | | 80 | 30 | 60 | 9 | 7 | 780 | 22 |
| | 10 | | 80 | 24 | 60 | 9 | 10 | 590 | 20 |
| | 11 | | 90 | 48 | 60 | 16 | 2 | 350 | 30 |
| | 12 | | 85 | 40 | 60 | 16 | 5 | 140 | 16 |
| | 13 | | 80 | 35 | 60 | 16 | 7 | 220 | 24 |
| | 14 | | 80 | 30 | 60 | 16 | 8 | 410 | 18 |
| | 15 | | 80 | 24 | 60 | 16 | 10 | 1070 | 10 |

*: Ratio to the melting point of the Ti-Al alloy a highly practical and highly reliable semiconductor memory such as FRAM and DRAM.

Next, concrete embodiments of the present invention will be explained.

Embodiment 1

High-purity Ti and Al pieces were melted by the cold wall melting method to produce alloy ingots (diameter 105 mm) whose Al contents were as shown in Table 1 respectively. In a cold wall melting process, the pressure before the start of the melting was set to $1\times10^{-6}$ Pa and degassing (baking) was carried out twice before the melting. The pressure was adjusted to $1\times10^{-5}$ Pa at the start of the melting and the pressure while the melting was carried out was set to $1\times10^{-4}$ Pa. Power supply at the start of the melting was set to 5 kW and the maximum pressure while the melting was carried out was set to 230 kW. Melting time was set to 40 minutes. Each of the alloy ingots obtained by such cold wall melting was subjected to solution treatment at the temperature and time shown in Table 1.

Next, each of the above alloy ingots was subjected to hot rolling at 1000° C. at the working ratio shown in Table 1, and Embodiment 2

High-purity Ti and Al pieces were melted by the arc melting method to produce alloy ingots (diameter 105 mm) whose Al contents were as shown in Table 2 respectively. The arc melting was carried out with 150 kW output after vaccumizing is first carried out up to $6.65\times10^{-3}$ Pa and Ar was introduced up to $1.9\times10^{4}$ Pa. The number of times the arc melting was carried out for each is as shown in Table 2. Next, each of the alloy ingots obtained by the arc melting was subjected to solution treatment at the temperature shown in Table 2 for 30 hours. These alloy materials were hot-rolled at 1000° C., and thereafter, each of Ti—Al alloy targets with the diameter 320 mm×thickness 10 mm was produced, similarly to the Embodiment 1.

As a result of X-ray diffraction of each of the Ti—Al alloy targets thus obtained, it was confirmed that only a Ti peak and a Ti—Al intermetallic compound peak appeared in any one of X-ray diffraction patterns. In other words, each of the Ti—Al alloy targets had a uniform structure constituted of a Ti—Al solid solution structure and a Ti—Al intermetallic compound structure. Variation in the Al content, an average oxygen content, and variation in the oxygen content of each of the Ti—Al alloy targets were further measured according to the aforesaid method. The measured results are shown in Table 2.

TABLE 2

| Sample No. | Melting | | Solution treatment Temperature* (%) | Al content (at %) | Al content variation (%) | Oxygen content (ppm) | Oxygen variation (%) |
| | Melting method | No. of times | | | | | |
|---|---|---|---|---|---|---|---|
| EMBODIMENT 2 | Arc melting method | 3 | 90 | 4 | 3 | 350 | 11 |
| | | 2 | 80 | 4 | 5 | 530 | 8 |
| | | 2 | 85 | 4 | 6 | 640 | 14 |
| 4 | | 2 | 80 | 4 | 8 | 420 | 18 |
| 5 | | 2 | 80 | 4 | 10 | 270 | 16 |
| 6 | | 3 | 90 | 7 | 2 | 160 | 5 |
| 7 | | 3 | 80 | 7 | 3 | 290 | 4 |
| 8 | | 2 | 90 | 7 | 6 | 740 | 20 |
| 9 | | 2 | 85 | 7 | 7 | 860 | 26 |
| 10 | | 2 | 85 | 7 | 9 | 530 | 12 |
| 11 | | 4 | 80 | 18 | 1 | 380 | 22 |
| 12 | | 3 | 80 | 18 | 4 | 320 | 19 |
| 13 | | 3 | 85 | 18 | 5 | 480 | 37 |
| 14 | | 2 | 85 | 18 | 7 | 990 | 10 |
| 15 | | 2 | 90 | 18 | 8 | 940 | 13 |

*: Ratio to the melting point of the Ti-Al alloy

Embodiment 3

High-purity Ti and Al pieces were melted (degree of vacuum $1.33 \times 10^3$ Pa, output 80 kW) by the EB melting method to produce alloy ingots (diameter 105 mm) whose Al contents were as shown in Table 3 respectively. The number of times the EB melting was carried out is as shown in Table 3. Next, each of the alloy ingots obtained by the EB melting was subjected to solution treatment at the temperature shown in Table 3 for 30 hours. These alloy materials were hot-rolled at 1000° C., and thereafter, each of Ti—Al alloy targets with the diameter 320 mm×thickness 10 mm was produced, similarly to the Embodiment 1.

As a result of X-ray diffraction of each of the Ti—Al alloy targets thus obtained, it was confirmed that only a Ti peak and a Ti—Al intermetallic compound peak appeared in any one of X-ray diffraction patterns. In other words, each of the Ti—Al alloy targets had a uniform structure constituted of a Ti—Al solid solution structure and a Ti—Al intermetallic compound structure. Variation in the Al content, an average oxygen content, and variation in the oxygen content of each of the Ti—Al alloy targets were further measured according to the aforesaid method. The measured results are shown in Table 3.

TABLE 3

| Sample No. | Melting | | Solution treatment Temperature* (%) | Al content (at %) | Al content variation (%) | Oxygen content (ppm) | Oxygen variation (%) |
| | Melting method | No. of times | | | | | |
|---|---|---|---|---|---|---|---|
| E3 | 1 | EB melting method | 3 | 90 | 9 | 3 | 420 | 9 |
| | 2 | | 3 | 85 | 9 | 4 | 370 | 14 |

TABLE 3-continued

| Sample No. | Melting | | Solution treatment Temperature* (%) | Al content (at %) | Al content variation (%) | Oxygen content (ppm) | Oxygen variation (%) |
| | Melting method | No. of times | | | | | |
|---|---|---|---|---|---|---|---|
| 3 | ing method | 2 | 80 | 9 | 6 | 560 | 6 |
| 4 | | 2 | 80 | 9 | 7 | 840 | 18 |
| 5 | | 2 | 90 | 9 | 9 | 920 | 22 |

*: Ratio to the melting point of the Ti-Al alloy
E3 = Embodiment 3

COMPARATIVE EXAMPLES 1 TO 4

As Comparative Example 1 with the present invention, a Ti—Al alloy target was prepared in the same manner as in Embodiment 1 except that a compacted and sintered Ti—Al alloy material (sintered compact) was used. As Comparative Example 2 and Comparative Example 3, Ti—Al alloy targets were prepared in the same manner as that for the sample No. 13 of Embodiment 2 and the sample No. 3 of Embodiment 3 respectively except that the arc melting or the EB melting was carried out once respectively.

Further, as Comparative Example 4, a Ti—Al alloy target was prepared in the same manner as that for the sample No. 9 of Embodiment 1 except that the solution treatment was not carried out in the cold wall method. Variation in the Al content, an average oxygen content, and variation in the oxygen content of each of the Ti—Al alloy targets in Comparative Examples 1 to 4 were measured according to the aforesaid method. The measured results are shown in Table 4.

TABLE 4

| | Melting method | Al content (aat %) | Al content variation (%) | Oxygen content (ppm) | Oxygen content variation (%) |
|---|---|---|---|---|---|
| Comparative Example 1 | (sintering method) | 15 | 3 | 4800 | 35 |
| Comparative Example 2 | Arc melting method (once) | 15 | 13 | 600 | 14 |
| Comparative Example 3 | EB melting method (once) | 15 | 22 | 600 | 15 |
| Comparative Example 4 | Cold wall method | 9 | 18 | 690 | 22 |

Next, Ti—Al—N films were formed on Si(100) substrates to be approximately 10 to 100 nm in thickness by reactive sputtering, using the Ti—Al alloy targets of the examples 1 to 3 and the comparative examples 1 to 3 described above. Mixed gas of $N_2$ and Ar ($N_2$=3 sccm, Ar=30 sccm) was used as sputtering gas, and substrate temperature was set to 600° C. As each of the Si(100) substrates, a substrate surface-etched with a 1% HF solution for three minutes and rinsed off with ultra pure water for 30 minutes was used. The number of the Si substrates on which the Ti—Al—N films were formed was 500 respectively.

Crystallinity of each of the Ti—Al—N films thus formed was confirmed by RHEED (Reflection High Energy Electron Diffraction) provided in a vacuum chamber. In other words, judgment was made from diffraction patterns of RHEED on whether or not it was an epitaxial film. It was observed for each of the 500 Si substrates used for the film forming in each of the examples whether or not each of the Ti—Al—N films was epitaxially grown. The results are summarized in Table 5. The values in Table 5 indicate the number of the epitaxially grown films among the 500 films in percentage (%).

Next, using each of the above-described Ti—Al—N films as a barrier film, a Pt film is formed thereon by RF magnetron sputtering (substrate temperature 500° C.) to be a lower electrode. The thickness of the Pt film was approximately 100 nm. A $BaTiO_3$ film (approximately 200 nm in film thickness) was further formed thereon as a dielectric film by the RF magnetron sputtering. At this time, substrate temperature was set to 600° C. and 100% $O_2$ was used as sputtering gas.

Observation on whether or not each of the $BaTiO_3$ films was epitaxially grown was made in the same manner as in the observation on the Ti—Al—N film. The results are also shown in Table 5. The values in Table 5 indicate the number of the epitaxially grown films among the 500 films in percentage (%). Further, a Pt film was formed as an upper electrode at room temperature by the RF magnetron sputtering using lift-off, thereby producing a thin-film capacitor for FRAM.

TABLE 5

| Sample No. | Evaluation result of epitaxial growth property of Ti-Al-N film (%) | Evaluation result of epitaxial growth property of BTO film (%) |
|---|---|---|
| Embodiment 1 | | |
| 1 | 98 | 98 |
| 2 | 97 | 95 |
| 3 | 96 | 96 |
| 4 | 94 | 94 |
| 5 | 90 | 90 |
| 6 | 95 | 95 |
| 7 | 99 | 98 |
| 8 | 94 | 93 |
| 9 | 92 | 91 |
| 10 | 91 | 90 |
| 11 | 98 | 97 |
| 12 | 96 | 94 |
| 13 | 93 | 92 |
| 14 | 91 | 91 |
| 15 | 90 | 90 |
| Embodiment 2 | | |
| 1 | 97 | 96 |
| 2 | 94 | 93 |
| 3 | 93 | 92 |
| 4 | 91 | 90 |
| 5 | 91 | 90 |
| 6 | 99 | 97 |
| 7 | 98 | 97 |
| 8 | 94 | 93 |
| 9 | 92 | 92 |
| 10 | 91 | 90 |
| 11 | 97 | 96 |
| 12 | 92 | 91 |
| 13 | 93 | 92 |
| 14 | 91 | 90 |
| 15 | 90 | 90 |
| Embodiment 3 | | |
| 1 | 96 | 95 |
| 2 | 95 | 95 |
| 3 | 94 | 93 |
| 4 | 92 | 92 |
| 5 | 90 | 90 |
| Comparative Example 1 | 55 | 50 |
| Comparative Example 2 | 90 | 69 |
| Comparative Example 3 | 74 | 53 |
| Comparative Example 4 | 81 | 72 |

As is apparent from Table 5, all of the Ti—Al—N films formed by using the respective sputter targets according to the examples 1 to 3 are excellent in the epitaxial growth property, and in accordance with this, enable good epitaxial growth of the $BaTiO_3$ films. Further, it was confirmed that all of the $BaTiO_3$ films according to the Embodiments 1 to 3 have good remanent polarization.

Embodiment 4

High-purity Ti and Al pieces were melted by the cold wall melting method to prepare a plurality of alloy ingots (75 to 105 mm in diameter) whose Al content was 9 atm %. Next, these alloy ingots were subjected to hot rolling (a working ratio 80%) at 1000° C., and thereafter, were annealed for one hour at the temperature shown in Table 2 respectively for recrystallization.

After these alloy ingots were ground and polished, they are diffusion-bonded to backing plates made of Al by hot pressing respectively and were further subjected to machining, thereby preparing Ti—Al alloy targets with the diameter 320 mm×thickness 10 mm.

An average crystal grain diameter of each of the Ti—Al alloy target thus obtained and variation therein were measured according to the aforesaid method. The measured results are shown in Table 6. Incidentally, each of the Ti—Al alloy targets had a uniform structure constituted of a Ti—Al solid solution structure and a Ti—Al intermetallic compound structure similarly to Embodiment 1. Further, variation in the Al content was also similar to Embodiment 1.

Ti—Al—N films were formed on Si(100) substrates to be approximately 10 to 100 nm in thickness by reactive sputtering, using the above-described Ti—Al alloy targets respectively. The film forming conditions of the Ti—Al—N films were as described above. The number of the Si substrates was 500 respectively.

The number of dusts having the size of 1 μm or larger among dusts existing in each of the Ti—Al—N films thus obtained was measured with a particle counter. The results are also shown in Table 6. The number of the dusts in Table 6 is an average value among 500 films. Incidentally, when crystallinity of each of the films was confirmed by RHEED provided in a vacuum chamber, it was a diffraction pattern of an epitaxial film and a streak was observed, thereby confirming that a smooth epitaxial film was formed.

TABLE 6

| Sample No. | Ti-Al alloy target | | | | Average number of dust [1 μm or larger in size] (number/piece) |
| --- | --- | --- | --- | --- | --- |
| | Thermal treatment temperature (° C.) | Average crystal grain diameter (μm) | Crystal grain diameter variation (%) | | |
| Embodiment 4 | 1 | 900 | 140 | 11 | 3.8 |
| | 2 | 1000 | 130 | 23 | 7.8 |
| | 3 | 1050 | 220 | 9 | 7.2 |
| Comparative Exmple 5 | 1 | 750 | 120 | 42 | 47.8 |
| | 2 | 1200 | 640 | 22 | 39.1 |
| | 3 | 1300 | 730 | 37 | 53.6 |

As is apparent from Table 6, only a small number of dusts are included in all of the Ti—Al—N films formed by using the respective sputter targets according to the example 4. Therefore, the use of such a Ti—Al—N film as a barrier film can improve production yields of various kinds of devices.

INDUSTRIAL APPLICABILITY

As is apparent from the above-described embodiment, according to the sputter target of the present invention, it is made possible to form a Ti—Al—N film or the like excellent in the characteristic and quality as a barrier film with good reproducibility. Therefore, the use of a barrier film made of such a Ti—Al—N film can realize improvement in the characteristic and yields of various kinds of electronic components. The barrier film of the present invention is especially suitable for FRAM and DRAM using a perovskite oxide film as a dielectric film.

What is claimed is:

1. A sputter target for forming an epitaxial grown barrier film, the sputter target comprising a Ti—Al alloy containing 1 to 30 atomic % of Al
wherein Al in said Ti—Al alloy exists in at least one of a solid solution state in Ti and a state in which Al forms an intermetallic compound with Ti, and variation in Al content in the entire target is within 10%, wherein the variation of the Al content is defined according to the following expression:

variation (%)={(maximum value−minimum value)/(maximum value+minimum value)×100.

2. The sputter target according to claim 1, wherein said Ti—Al alloy has an average crystal grain diameter equal to 500 μm or less.

3. The sputter target according to claim 2, wherein variation in crystal grain diameter in the entire target is within 30%.

4. The sputter target according to claim 1, wherein an average oxygen content of said Ti—Al alloy is 900 ppm or less.

5. The sputter target according to claim 4, wherein variation in the oxygen content in the entire target is within 30%.

6. The sputter target according to claim 1, wherein said sputter target is bonded to a backing plate.

7. A sputter target for forming an epitaxial growth barrier film, said sputter target comprising a Ti—Al alloy whose Al content is in a range of 1 to 30 atm %,
wherein Al in said Ti—Al alloy exists in at least one of a solid solution state in Ti and a state in which Al forms an intermetallic compound with Ti, an average crystal grain diameter of said Ti—Al alloy is 500 μm or smaller, and variation in crystal grain diameter in the entire target is within 30% wherein the variation of the crystal grain diameter is defined according to the following expression:

variation (%)={(maximum value−minimum value)/(maximum value+minimum value)×100.

8. The sputter target according to claim 7, wherein said sputter target is bonded to a backing plate.

9. A barrier film comprising a Ti—Al—N film formed by using the sputter target according to claim 1, wherein said barrier film is an epitaxially grown film having a thickness in a range of 10 to 100 nm.

10. The barrier film according to claim 9, wherein said Ti—Al—N film is used as a barrier material for a semiconductor substrate.

11. A barrier film comprising a Ti—Al—N film formed by using the sputter target according to claim 7, wherein said barrier film is an epitaxially grown film having a thickness in a range of 10 to 100 nm.

12. The barrier film according to claim 11, wherein said Ti—Al—N film is used as a barrier material for a semiconductor substrate.

13. An electronic component comprising the barrier film according to claim 9.

14. The electronic component according to claim 13, comprising:
a semiconductor substrate, said barrier film epitaxially formed on said semiconductor substrate, and a thin-film capacitor which is epitaxially formed on said barrier film.

15. An electronic component comprising the barrier film according to claim 11.

16. The electronic component according to claim 15, comprising:
a semiconductor substrate, said barrier film epitaxially formed on said semiconductor substrate, and a thin-film capacitor epitaxially formed on said barrier film.

17. The sputter target according to claim 1, wherein the variation of the Al content is within 5% or less.

18. The sputter target according to claim 7, wherein the crystal grain diameter of the Ti—Al alloy target is 300 μm or smaller.

* * * * *